(12) United States Patent
So et al.

(10) Patent No.: US 8,656,252 B2
(45) Date of Patent: Feb. 18, 2014

(54) MEMORY CONTROLLER AND NON-VOLATILE STORAGE DEVICE

(75) Inventors: Hirokazu So, Kyoto (JP); Toshiyuki Honda, Kyoto (JP)

(73) Assignee: Panasonic Corporation, Osaka (JP)

( * ) Notice: Subject to any disclaimer, the term of this patent is extended or adjusted under 35 U.S.C. 154(b) by 33 days.

(21) Appl. No.: 13/463,170

(22) Filed: May 3, 2012

(65) Prior Publication Data

US 2012/0317458 A1 Dec. 13, 2012

(30) Foreign Application Priority Data

Jun. 8, 2011 (JP) ................................. 2011-127885
Mar. 28, 2012 (JP) ................................. 2012-073944

(51) Int. Cl.
*G11C 29/00* (2006.01)
(52) U.S. Cl.
USPC ............. 714/763; 714/758; 714/771; 714/52; 714/773
(58) Field of Classification Search
None
See application file for complete search history.

(56) References Cited

U.S. PATENT DOCUMENTS

| 7,757,038 | B2 | 7/2010 | Kitahara | |
| 7,809,994 | B2 * | 10/2010 | Gorobets | 714/52 |
| 8,484,542 | B2 * | 7/2013 | d'Abreu et al. | 714/785 |
| 2008/0098158 | A1 | 4/2008 | Kitahara | |
| 2008/0141099 | A1 * | 6/2008 | Katoh et al. | 714/758 |
| 2009/0210611 | A1 | 8/2009 | Mizushima | |
| 2010/0241797 | A1 | 9/2010 | Kitahara | |
| 2011/0214034 | A1 * | 9/2011 | Otsuka | 714/758 |
| 2012/0110417 | A1 * | 5/2012 | D' Abreu et al. | 714/773 |

FOREIGN PATENT DOCUMENTS

| JP | 2005-292925 | 10/2005 |
| JP | 2008-102819 | 5/2008 |
| JP | 2009-199199 | 9/2009 |

* cited by examiner

*Primary Examiner* — John Trimmings
(74) *Attorney, Agent, or Firm* — Wenderoth, Lind & Ponack, L.L.P.

(57) ABSTRACT

A non-volatile storage device includes one or more non-volatile memories for storing data, and a memory controller for carrying out the control of the non-volatile memory. The non-volatile memory includes the plurality of blocks, which are erase units, and the block includes the plurality of pages, which are write units of data, in each of the blocks at least one set of pages existing which include at least two pages sharing one word line. The memory controller configures a plurality of error correcting groups, each including at least one data page, which is a page for storing data, and at least one error correcting code page for storing a code for error correcting calculation of the data page, and assigns a page of a separate word line with respect to each of the data page and the error correcting page in the same error correcting group.

12 Claims, 13 Drawing Sheets

Fig.5

| FIRST PAGE NUMBER | SECOND PAGE NUMBER |
|---|---|
| 0 | 2 |
| 1 | 4 |
| 3 | 6 |
| 5 | 8 |
| ⋮ | ⋮ |
| 123 | 126 |
| 125 | 127 |

※FIRST PAGE NUMBER : 2n-1、SECOND PAGE NUMBER : 2n+2
n : $1 \leq n \leq 62$

MEMORY CONTROLLER AND NON-VOLATILE STORAGE DEVICE

BACKGROUND

1. Technical Field

The present invention relates to a memory controller for controlling a non-volatile memory, and a non-volatile storage device such as a semiconductor memory card including the non-volatile memory and the memory controller.

2. Related Art

In recent years, a demand for a non-volatile storage device including a rewritable non-volatile memory is increasing, centering on a semiconductor memory card.

The semiconductor memory card has various features such as being small and light weight, having large capacity and resistance to quake, and being easy and convenient to handle, and hence the demand for such a semiconductor memory card is increasing as a recording medium of a portable device such as a digital still camera or a portable telephone. Recently, a slot for the semiconductor memory card is provided as a standard not only in the portable device but also in a stationary device such as a digital television and a DVD recorder, and thus the demand for the semiconductor memory card is further increasing.

The semiconductor memory card described above includes a flash memory (mainly NAND flash memory) serving as a non-volatile main storage memory, and has a memory controller for controlling the same. The memory controller carries out read/write control of data with respect to the flash memory in accordance with a read/write command of data from an access device represented by a digital still camera main body, or the like.

The writing of data from the memory controller to the flash memory is carried out in units called a page. The main stream in a recent flash memory is a page size of about 4 kB (kilobyte) or 8 kB.

The flash memory includes a number of storage elements called cells, and stores information by accumulating or discharging charges to and from each cell. The writing of data to each cell is carried out by applying voltage to a word line and a bit line connected to the cell. A page, which is a write unit of the data, is configured by a plurality of cells sharing a word line.

Meanwhile, the information stored in the cell may get lost due to failure or degradation of the cell. The memory controller thus generally generates an error correcting code with respect to write data from the access device, and stores the same in the flash memory with the write data. Thus, even if an error occurs during the reading of the data, correction can be made if the number of error bits is within a correction capability of the error correcting code to be applied, so that correct data can be read. For example, Japanese Patent Publication No. 2005-292925 proposes a method of alternately storing the write data (user data) and the error correcting code (additional data) in a page of the flash memory.

In the method described above, however, correct data cannot be read if an error beyond the correction capability of the error correcting code occurs during the reading of the data.

SUMMARY

The present invention has been made in view of the above problems, and an object of the present invention is to provide a non-volatile storage device capable of correctly reading data even if an error beyond the correction capability of the error correcting code occurs during the reading of the data.

To solve the above problems, the present inventors have devised a method of further giving a second error correcting code with respect to a set of data to which an error correcting code (hereinafter referred to as first error correcting code) is given. For example, the present inventors have devised a method of giving a parity of one page with respect to the data for four pages as the second error correcting code. In this manner, even if an error beyond the correction capability of the first error correcting code occurs, correct data can be read by using the second error correcting code (parity).

However, according to the method described above, if a failure occurs in the word line corresponding to the page storing the data, all the cells configuring the page are influenced by the failure of the word line and a burst error occurs when reading the relevant page. As a result, correct data may not be read if the number of error bits exceeds a correction capability of an error correcting code to be applied. In particular, one word line is shared by a plurality of pages in the flash memory of multi-level cell (MLC), which is increasing in recent years. Thus, the range of data loss by the failure of one word line is increasing, and the influence thereof is becoming greater.

Generally, the burst error caused by the failure of the word line is assumed to have lower occurrence probability than a random error caused by the defect of a cell, or the like. However, in a system where high reliability of stored data is to be ensured, it is desired that the reading of data is prevented from being disabled as much as possible due to the occurrence of the burst error.

In view of the above problems, it is an object of the present invention to provide a non-volatile storage device and a memory controller capable of correctly reading the stored data even if a burst error caused by the word line failure occurs in the non-volatile memory.

A non-volatile storage device according to the present invention relates to a non-volatile storage device, which communicates with an access device and carries out reading and/or writing of data in accordance with a command from the access device, the device including one or more non-volatile memories for storing data; and a memory controller for carrying out control of the non-volatile memory; wherein the non-volatile memory includes a plurality of blocks, which are erase units, each of the blocks including a plurality of pages, which are write units of data, in each of the blocks at least one set of pages existing which include at least two pages sharing one word line; and the memory controller, configures a plurality of error correcting groups each including at least one data page, which is a page for storing data, and at least one error correcting code page for storing a code for error correcting calculation of the data page, and assigns a page of a separate word line with respect to each of the data page and the error correcting page in the same error correcting group.

A memory controller according to the present invention relates to a memory controller for carrying out control of one or more non-volatile memories for storing data, wherein the non-volatile memory includes a plurality of blocks, which are erase units, each of the blocks including a plurality of pages, which are write units of data, in each of the blocks at least one set of pages existing which include at least two pages sharing one word line; and the memory controller, configures a plurality of error correcting groups each including at least one data page, which is a page for storing data, and at least one error correcting code page for storing a code for error correcting calculation of the data page, and assigns a page of a separate word line with respect to each of the data page and the error correcting page in the same error correcting group.

According to the present invention, a second error correcting code is given to a set of data given a first error correcting code, and then stored in a non-volatile memory. Thus, the data can be correctly read even if an error beyond a correction capability of the first error correcting code occurs when reading the data. Furthermore, according to the present invention, even if a burst error caused by a failure in one word line occurred in the non-volatile memory, other data pages and parity pages configuring the parity group can be read by other word lines. Accordingly, the data page in which the burst error occurred can be restored, and as a result, the stored data can be correctly read.

BRIEF DESCRIPTION OF DRAWINGS

FIG. 5 is an explanatory view showing one example of a combination of pages sharing the word line in the non-volatile memory according to the first embodiment of the present invention;

DETAILED DESCRIPTION OF PREFERRED EMBODIMENT

Hereinafter, embodiments of the present invention will be described with reference to the drawings.

First Embodiment 1.1 Configuration of Non-Volatile Storage System

A configuration of a non-volatile storage system 1000 according to a first embodiment of the present invention will be described with reference to FIGS. 1 to 5.

Figure 1:
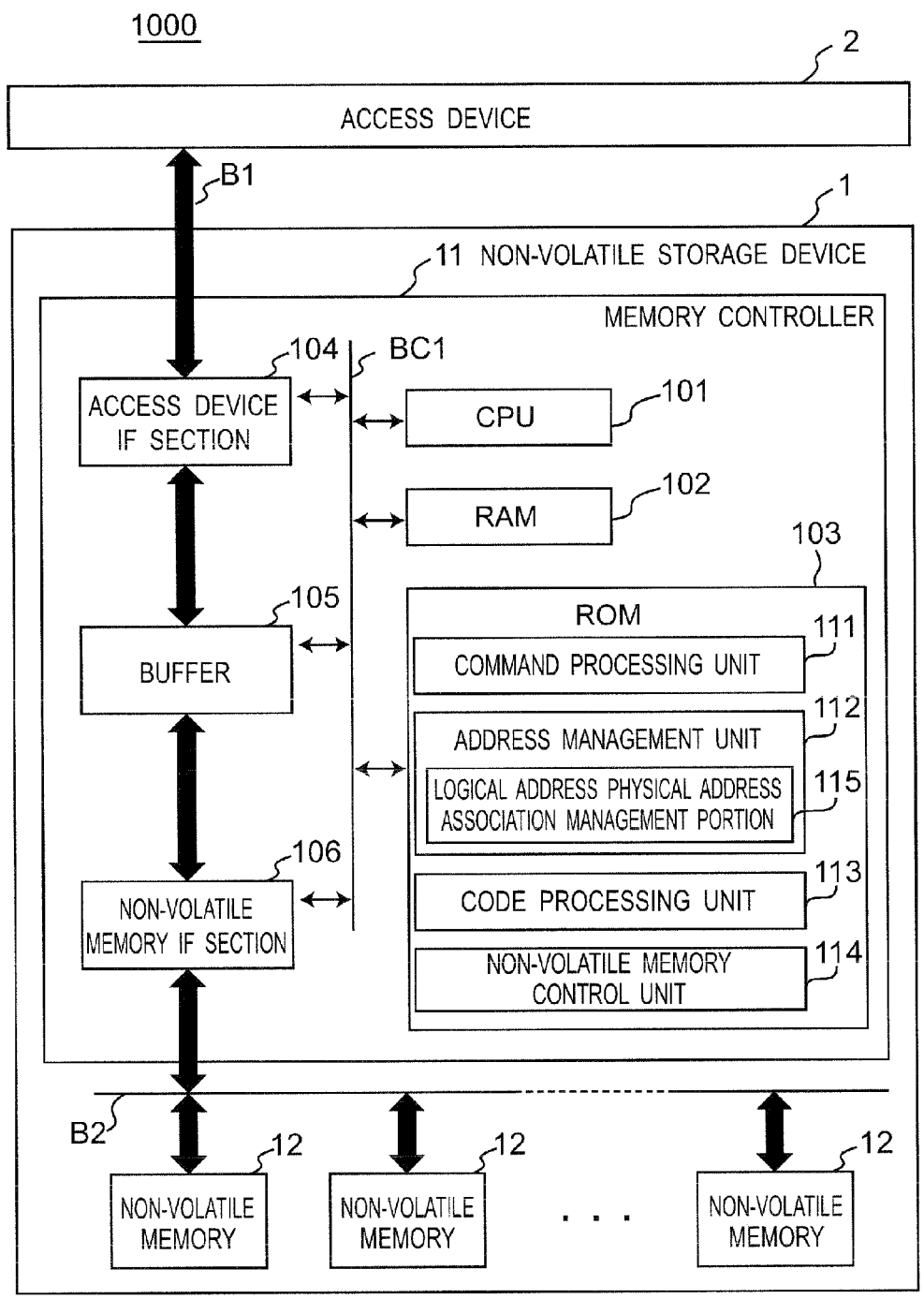
FIG. 1 is a block diagram showing a configuration of a non-volatile storage system according to a first embodiment of the present invention.

FIG. 1 is a schematic configuration diagram of the non-volatile storage system 1000 according to the first embodiment of the present invention. As shown in FIG. 1, the non-volatile storage system 1000 includes a non-volatile storage device 1 and an access device 2, to which the non-volatile storage device 1 is attached. The non-volatile storage device 1 and the access device 2 are connected by a bus B1, so that communication can be carried out bi-directionally. The non-volatile storage device 1 carries out reading and/or writing of data in accordance with a command from the access device 2. In this case, the non-volatile storage device 1 is, for example, a semiconductor memory card. The access device 2 is, for example, a digital still camera for recording a still image content in a semiconductor memory card.

As shown in FIG. 1, the non-volatile storage device 1 includes a memory controller 11, and one or more non-volatile memories 12 for storing data. The memory controller 11 and the non-volatile memory 12 are connected by a bus B2. The memory controller 11 transmits and receives data, that is, carries out reading/writing of data as well as transmission of a command and reception of a response with the non-volatile memory 12 via the bus B2 to control the non-volatile memory 12. If a plurality of non-volatile memory 12 are provided, a plurality of bus B2 may be provided.

The memory controller 11 is a module that carries out the entire control of the non-volatile storage device 1, and is configured, for example, as an LSI (Large Scale Integration) including a CPU and the like. The non-volatile memory 12 is, for example, a NAND flash memory.

As shown in FIG. 1, the memory controller 11 includes a CPU 101, RAM 102, a ROM 103, an access device IF (interface) section 104, a buffer 105, and a non-volatile memory IF (interface) section 106. As shown in FIG. 1, each function section of the memory controller 11 is connected via a bus BC1. The memory controller 11 may have a configuration in which all or part of the function sections of the memory controller 11 is directly connected.

The access device IF section 104 is a connecting section of the non-volatile storage device 1 and the access device 2. The transmission and reception of control signals and data of the access device 2 and the non-volatile storage device 1 are carried out through the access device IF section 104.

The non-volatile memory IF section 106 is a connecting section of the memory controller 11 and the non-volatile memory 12. The transmission and reception of control signals and data of the memory controller 11 and the non-volatile memory 12 are carried out through the non-volatile memory IF section 106.

The buffer 105 is a memory for temporarily storing data received from the access device 2 via the access device IF section 104, data transmitted (output) to the access device 2 via the access device IF section 104, data read from the non-volatile memory 12 via the non-volatile memory IF section 106, data to write to the non-volatile memory 12 via the non-volatile memory IF section 106, and the like.

The ROM 103 stores a program for controlling the non-volatile storage device 1. This program is loaded to the RAM 102 and then executed by the CPU 101.

Specifically, as shown in FIG. 1, the ROM 103 includes a command processing unit 111, an address management unit 112, a code processing unit 113, and a non-volatile memory control unit 114. In the present embodiment, the command processing unit 111, the address management unit 112, the code processing unit 113, and the non-volatile memory control unit 114 are assumed to be implemented by software on the ROM 103, but the present invention is not limited thereto, and all or part of the command processing unit 111, the address management unit 112, the code processing unit 113, and the non-volatile memory control unit 114 may be implemented by hardware.

The command processing unit 111 is a function unit for interpreting the command and the parameter related to the command received from the access device 2 via the access device IF section 104, and executing the process of the command.

The address management unit 112 carries out the overall address management of the non-volatile memory 12. The address management unit 112 particularly includes a logical address physical address association management portion 115. The logical address physical address association management portion 115 manages a physical address of a block in the non-volatile memory 12 stored with a conversion table associating a logical address in a logical address space provided by the non-volatile storage device 1 as an address space accessible from the access device 2 and a physical address of the non-volatile memory 12.

The address management unit 112 does not store valid data. Other than the physical address of the block storing the conversion table of the logical address and the physical address, the address management unit 112 manages a physical address of a free block, which is a block reusable for data write, a physical address of a defective block not usable for data write, and the like.

The code processing unit 113 carries out processing of the first and second error correcting codes with respect to the data read or written with respect the non-volatile memory 12. The error correcting code herein is, for example, a Reed Solomon code or parity.

The code processing unit 113 generates the first error correcting code with respect to the data at the time of writing data to the non-volatile memory 12. Furthermore, the code processing unit 113 generates data and the second error correcting code with respect to the data and the first correcting code of the relevant data. The data, the first error correcting code, and the second error correcting code are then written to the non-volatile memory 12.

Further, the code processing unit 113 reads the first error correcting code with the data when reading data from the non-volatile memory 12, and carries out detection and correction of error of the read data. If an error in which correction cannot be made by the first error correcting code is detected, the second error correcting code is further read from the non-volatile memory 12, and the detection and correction of the error are carried out.

The non-volatile memory control unit 114 is a device driver for processing a control signal transmitted and received via the non-volatile memory IF section 106.

Figure 2:
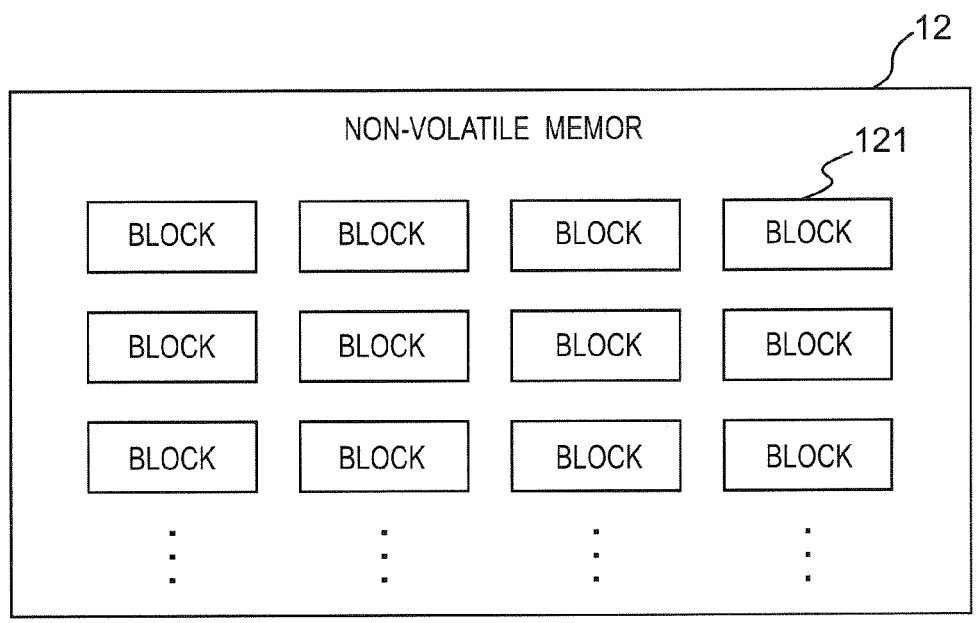
FIG. 2 is a diagram showing one example of a configuration of a non-volatile memory according to the first embodiment of the present invention.

FIG. 2 is a diagram showing a configuration example of the non-volatile memory 12 according to the present embodiment. The non-volatile memory 12 includes a plurality of blocks (physical blocks) 121, which are erase units of data. The size of each block 121 is about 1 MB (megabyte).

Figure 3:
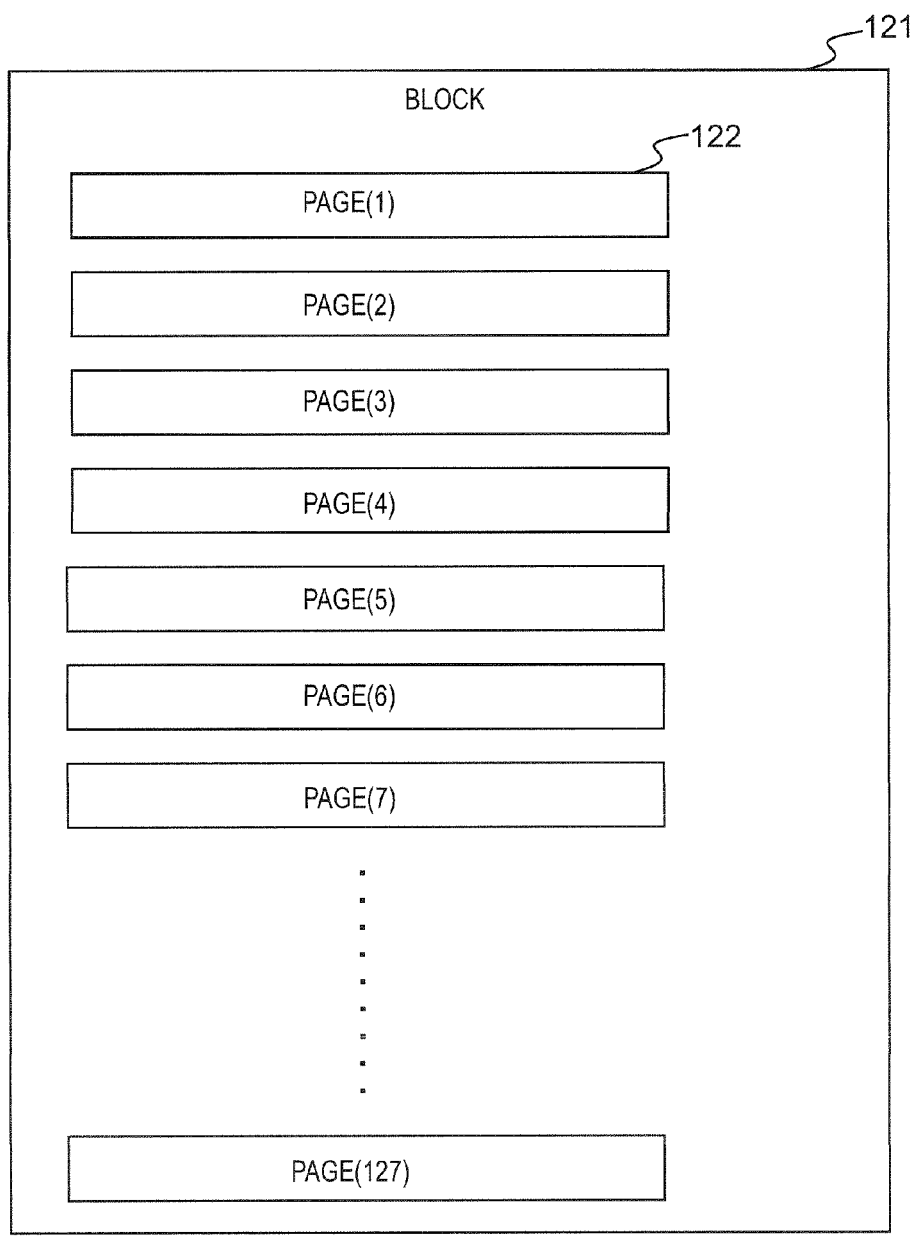
FIG. 3 is a diagram showing one example of a configuration of a block according to the first embodiment of the present invention.

FIG. 3 is a diagram showing a configuration example of the block 121 shown in FIG. 2. The block 121 includes a plurality of pages 122, which are write units of data. The size of each page 122 is about 8 kB, for example. The number of pages per one block 121 is, for example, 128 pages.

A page 122, which is a write unit of data, includes a number of memory elements called a cell, and stores information by accumulating and discharging charges to and from each cell. The writing of data to each cell is carried out by applying voltage to a word line and a bit line connected to the cell. The page 122 is configured by a plurality of cells sharing the word line.

Figure 4:
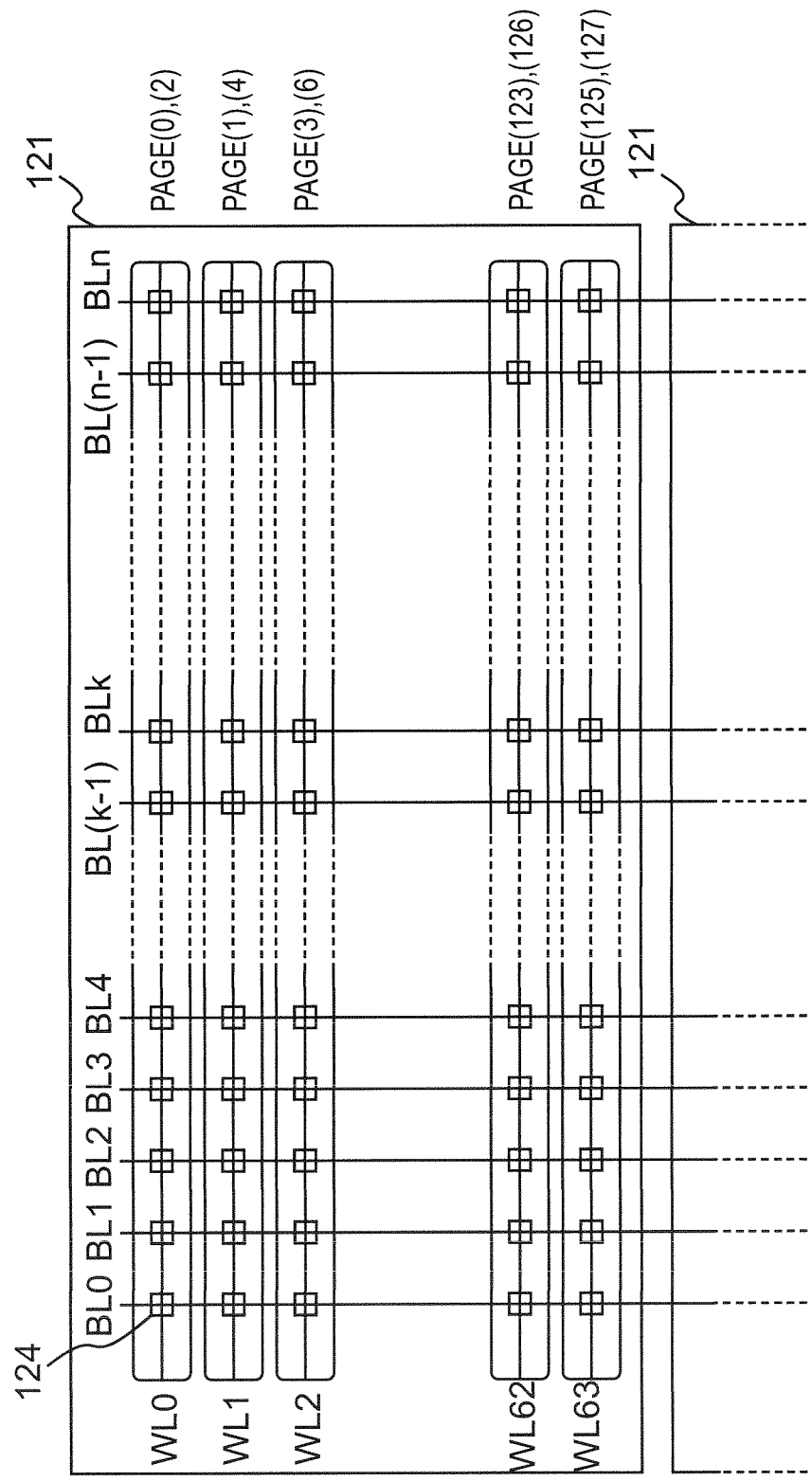
FIG. 4 is a diagram showing a configuration of a word line, a bit line, a page, and a block.

FIG. 4 is a diagram for describing a relationship of a word line, a bit line, a page, and a block of the non-volatile memory 12. A cell 124 is connected at an intersecting position of the word lines WL0, WL1, . . . and the bit lines BL0, BL1, . . . . In other words, a plurality of cells 124 are connected to one word line WL0, WL1, . . . . The non-volatile memory 12 of the present embodiment is a flash memory of a multi-level cell (MLC), where two pages (first page and second page) are assigned to one word line WL0, WL1 . . . . In other words, one word line WL0, WL1, . . . is shared by a plurality of pages (first page and second page).

In the following description, the mth page is indicated as "page (m)". For example, in FIG. 4, the word line WL0 is shared by page (0) and page (2).

FIG. 5 is a table showing a combination example of a page sharing the word line in the non-volatile memory according to the present embodiment. In the non-volatile memory 12, 128 pages 122 exist in the block 121, where a set of pages including two pages in the same block 121 shares one word line and a plurality of multi-level cells provided on the relevant one word line. In FIG. 5, the set of pages including two pages is made up of "first page" and "second page". In the combination example shown in FIG. 5, the respective set of page (0) and page (2), page (1) and page (4), . . . , page (123) and page (126), and page (125) and page (127) shares one word line and the plurality of multi-level cells provided on the relevant word line. More specifically, excluding the first and last combinations, a set of page (2n−1) and page (2n+2), n being a natural number smaller than or equal to 62, shares one word line and the plurality of multi-level cells provided on the relevant word line. The pages 122 of different blocks 121 do not share the word line (and plurality of multi-level cells provided on relevant word line).

The multi-level cell 124 configuring the non-volatile memory 12 in the examples shown in FIGS. 4 and 5 has four levels (four values). The multi-level cell 124 of the present embodiment may include more levels (values), in which case, one word line and the plurality of multi-level cells 124 provided on the relevant one word line may be shared by a set of pages made up of pages more than two pages.

1.2 Arrangement of Error Correcting Code

Next, the arrangement of the first and second error correcting codes when the memory controller 11 stores data in the non-volatile memory 12 will be described with reference to FIGS. 6 to 9.

Figure 6:
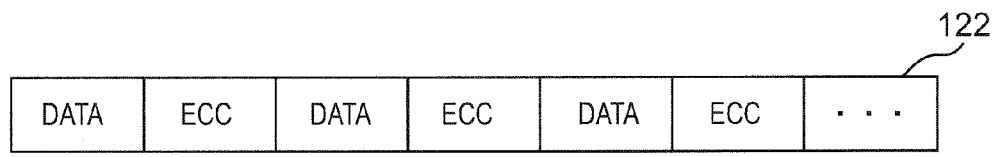
FIG. 6 is a diagram showing one example of a configuration of a data page according to the first embodiment of the present invention.

FIG. 6 is a diagram showing one example of a configuration of a page storing the data (hereinafter referred to as data page) according to the present embodiment. In the data page, the data and the first error correcting code with respect to the relevant data are arranged in the page. In FIG. 6, the first error correcting code is described as "ECC".

As shown in FIG. 6, when giving the first error correcting code in a divided manner with respect to the data stored in the page, the data and the first error correcting code are alternately arranged with the divided data and the first error correcting code with respect to the divided data as a set.

When reading the data from the non-volatile memory 12, the first error correcting code with respect to the data is always read with the data, and thus the overhead of a control signal at the time of reading (e.g., address specification or the like) can be reduced by continuously arranging them in the same page.

FIGS. 7(a) and 7(b) are diagrams each showing an example in which the second error correcting code is given to one or more data pages (hereinafter referred to as "parity group"), according to the present embodiment. In the present embodiment, parity is used for the second error correcting code, and a page storing the second error correcting code is referred to as a parity page.

The error correcting code other than the parity (e.g., Reed Solomon code) may be used as the second error correcting code. In this case, the parity group may be more generally referred to as an error correcting group.

In FIG. 7(a), one parity page is given with respect to four data pages to configure one parity group. In the parity page, for example, the value of XOR (exclusive OR) of the data stored in each data page is stored. Furthermore, the first error correcting code with respect to the value of the XOR is stored.

In FIG. 7(b), one pair of parity pages are provided with respect to four pairs of data pages to configure one parity group.

In FIGS. 7(a) and 7(b), the ratio of the data page and the parity page is 4 to 1, but other arbitrary ratios may be applied. The capacity of data that can be stored in the non-volatile memory 12 increases as the ratio of the data page becomes greater. The error correction capability with respect to the data page increases as the ratio of the parity page becomes greater.

Figure 8:
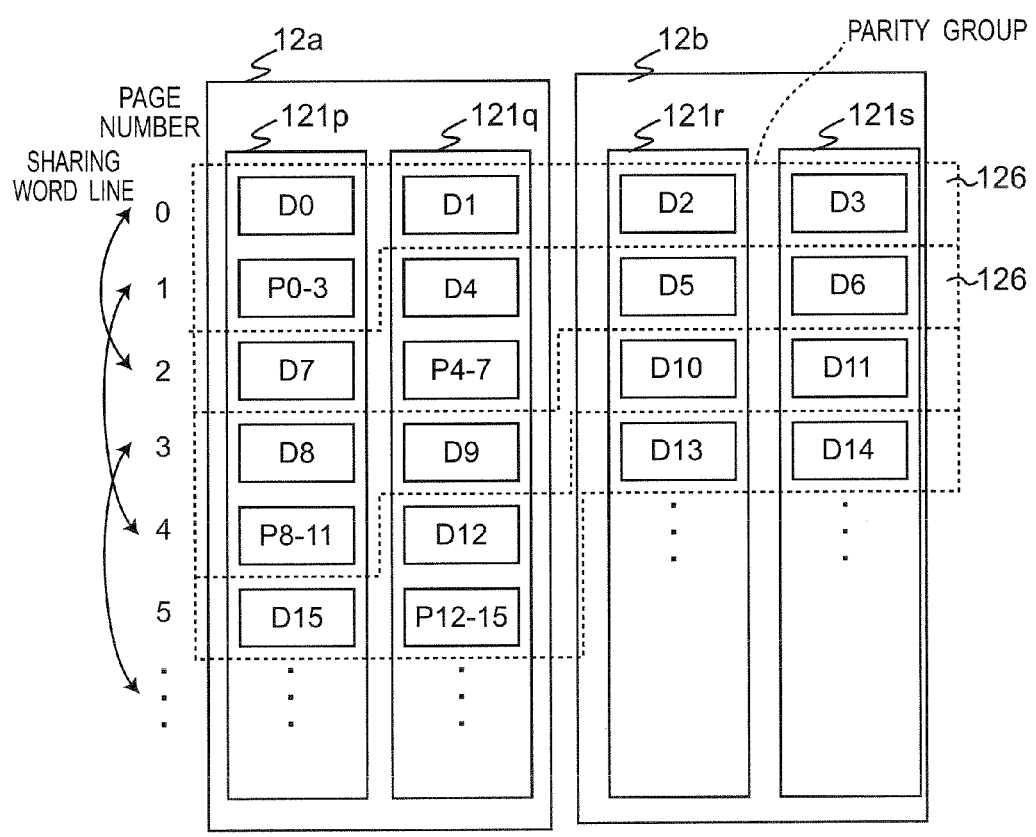
FIG. 8 is a diagram showing one example of a configuration of the parity group according to the first embodiment of the present invention.

FIG. 8 is a diagram showing one example of a configuration of a parity group according to the present embodiment. In FIG. 8, D0, D1, . . . , D15 represent the data page, P0-3 represents the parity page with respect to the data pages D0 to D3, P4-7 represents the parity page with respect to the data pages D4 to D7, P8-11 represents the parity page with respect to the data pages D8 to D11, P12-15 represents the parity page with respect to the data pages D12 to D15.

In particular, in the present embodiment, the data page and the parity page configuring each parity group are respectively arranged so as "not to share word line". For example, in the parity group configured by the data pages D0, D1, D2, D3 and the parity page P0-3, the data page D0 and the parity page P0-3 are arranged in different pages (page (0), page (1)) of the same block 121p, but such pages do not share a word line (see FIGS. 4 and 5). Furthermore, each data page D1, D2, D3 and the parity page P0-3 are arranged in different blocks, and hence each data page D1, D2, D3 and the parity page P0-3 do not share a word line.

Similarly, in the parity group configured by the data pages D4, D5, D6, D7 and the parity page P4-7, the data page D4 and the parity page P4-7 are arranged in different pages (page (1), page (2)) of the same block 121q, but such pages do not share a word line. Furthermore, each data page D5, D6, D7 and the parity page P4-7 are arranged in different blocks, and hence each data page D5, D6, D7 and the parity page P4-7 do not share a word line.

Therefore, even if a failure occurs in the word line configuring the data page and the bust error occurs in the reading of the data page, the possibility that the reading can be normally carried out is high since other data pages and the parity page configuring the parity group have different word lines. In this case, therefore, the information of the data page in which the burst error occurred can be restored using the parity page (second error correcting code).

Each parity group is arranged over four blocks 121p, 121q, 121r, 121s of the two non-volatile memories 12a, 12b. Thus, the writing of each parity group can be carried out at high speed by parallel writing with respect to different non-volatile memories (hereinafter referred to as interleave writing) and parallel writing with respect to different blocks in the same non-volatile memory (hereinafter referred to as multi-page programming). Furthermore, the writing of the successive parity groups can be carried out at high speed using the interleave writing and the multi-page programming.

Similarly, the reading of each parity group can be carried out at high speed by parallel reading with respect to different non-volatile memories (hereinafter referred to as interleave reading) and parallel reading with respect to different blocks in the same non-volatile memory (hereinafter referred to as multi-page reading). Furthermore, the reading of the successive parity groups can be carried out at high speed using the interleave reading and the multi-page reading.

In the arrangement of the parity group shown in FIG. 8, the ratio of the number of pages to be arranged in the non-volatile memory 12a and the number of pages to be arranged in the non-volatile memory 12b is 3:2. In proportion to such a ratio in the number of pages, ten (physical) blocks can be managed as a logical block by six (physical) blocks on the non-volatile memory 12a and four (physical) blocks on the non-volatile memory 12b. The six (physical) blocks of the non-volatile memory 12a corresponds to three sets of two blocks to carry out the multi-programming, and the four (physical) blocks of the non-volatile memory 12b corresponds to two sets of two blocks to carry out the multi-programming. Accordingly, the parity group can be stored without remaining with respect to the (physical) blocks configuring the logical block. Therefore, the address management process in the address management unit 112 can be simplified.

The parity group excluded in the first embodiment will be described below to further clarify the features of the first embodiment according to the present invention.

Figure 9:
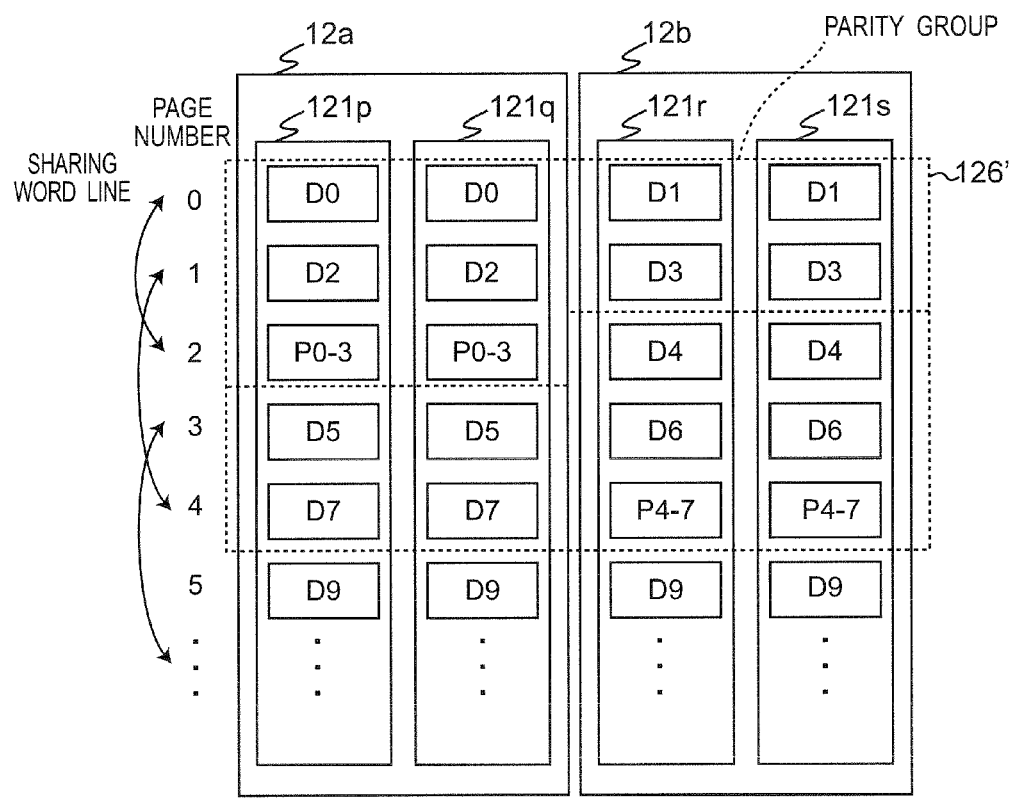
FIG. 9 is a diagram showing one example of a configuration of a parity group excluded in the embodiment of the present invention.

FIG. 9 is a diagram showing an example of a configuration of a parity group excluded in the present embodiment. In FIG. 9, D0, D1, . . . , D9 represent the data page, P0-3 represents the parity page with respect to D0 to D3, and P4-7 represents the parity page with respect to D4 to D7. Each data page and parity page are configured with two pages as a unit.

In the example of the configuration shown in FIG. 9, the data page and the parity page configuring each parity group are not arranged so as "not to share word line". For example, in the parity group configured by the data pages D0, D1, D2, D3 and the parity page P0-3, the data page D0 and the parity page P0-3 are arranged in different pages (page (0), page (2)) of the same block 121p, 121q, but such pages share a word line (see FIG. 4).

Therefore, when a failure occurs in the word line configuring the data page and the bust error occurs in the reading of the data page, the possibility that the reading cannot be normally carried out is high if the word line is common in the other data pages and the parity page configuring the parity group. In this case, the information of the data page in which the burst error occurred becomes difficult to restore using the parity page (second error correcting code). Thus, the example shown in FIG. 9 is a configuration of the parity group excluded in the present embodiment.

1.3 Operation of Non-Volatile Storage System

Figure 10:
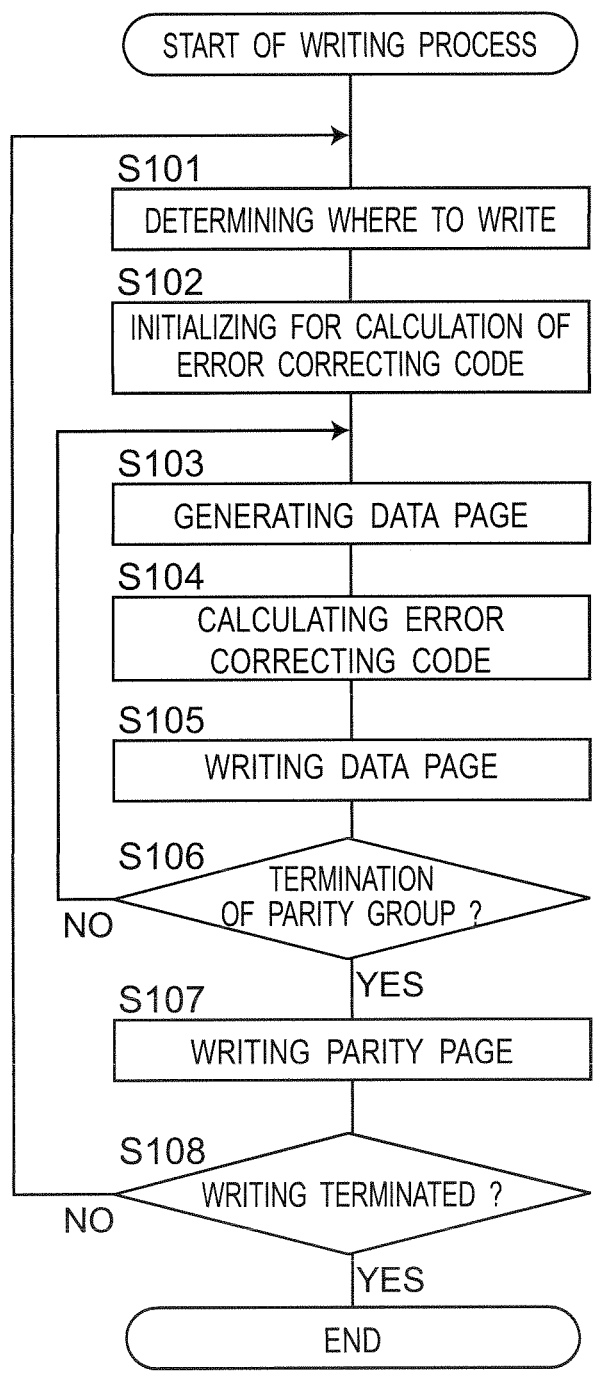
FIG. 10 is a flowchart showing a procedure of the writing process of the non-volatile storage device according to the first embodiment of the present invention.
Figure 11:
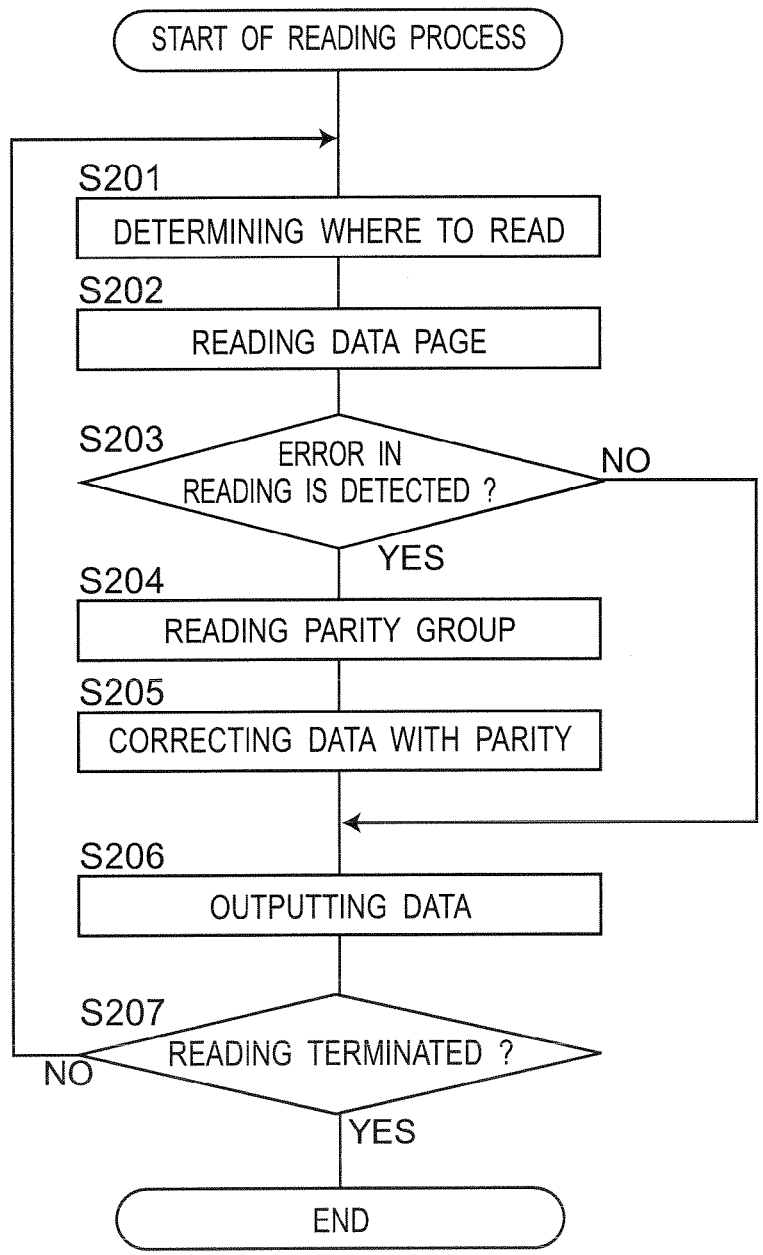
FIG. 11 is a flowchart showing a procedure of the reading process of the non-volatile storage device according to the first embodiment of the present invention.
Figure 12:
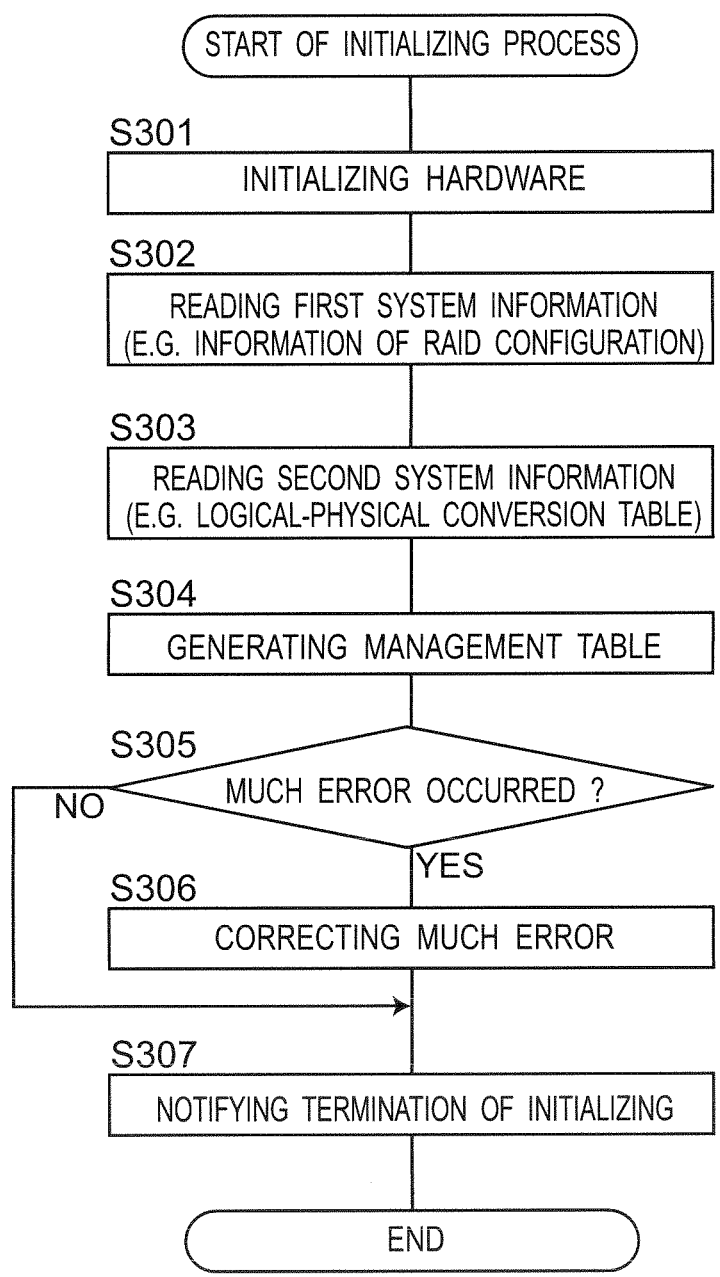
FIG. 12 is a flowchart showing a procedure of an initialization process of the non-volatile storage device according to the first embodiment of the present invention.

Next, the operation of the non-volatile storage system 1000 will be described with reference to FIGS. 10 to 12.

The non-volatile storage device 1 is attached to the access device 2, and performs the process corresponding to the command issued by the access device 2. The access device 2 issues a command (e.g., write command or read command) necessary for recording and reproduction of still image data, moving image data, and the like to the non-volatile storage device 1, and carries out transmission and reception of the data.

1.3.1 Writing Process

The access device 2 issues the write command to the non-volatile storage device 1 and transfers the write data so that the writing process is carried out in the non-volatile storage device 1. FIG. 10 is a flowchart showing a procedure of the writing process of the non-volatile storage device 1 according to the first embodiment of the present invention.

First, the process in step S101 will be described. Upon receiving the write command from the access device 2 through the access device IF section 104, the command processing unit 111 acquires parameters such as write address and size associated with the write command, specifies the logical address of the parity group for carrying out the writing from these parameters, and notifies the information to the address management unit 112. The address management unit 112 determines the physical write destination in the non-volatile memory 12 by referencing the information acquired from the command processing unit 111, the information of the conversion table of the logical address and the physical address acquired from the logical address physical address association management portion 115, the address information of the free block, and the information of a table managing the write state to the block (e.g., state related to data of what logical address is written up to which page in which block).

Next, the process in step S102 will be described. The command processing unit 111 instructs the code processing unit 113 to prepare for the writing. The code processing unit 113 ensures a region for calculation of the second error correcting code in the buffer 105, and sets a value of this region as an initial value.

Next, the process in step S103 will be described. The command processing unit 111 stores the write data from the access device 2 to the buffer 105 through the access device IF section 104. The code processing unit 113 generates the first error correcting code with respect to the write data. The information of the data page including the write data and the first error correcting code thereof is generated in the buffer 105. In generating the information of the data page, if the write data received from the access device 2 is not sufficient for it (e.g., when the access device 2 instructs writing from the address in the middle of the parity group or data page), the address management unit 112 is referenced to read the existing data of the non-volatile storage device 1 and generate the first error correcting code with respect thereto. The insufficiency in information of the data page is compensated by the existing data and the first error correcting code with respect thereto.

Next, the process in step S104 will be described. The code processing unit 113 references the value set in the region for calculation of the second error correcting code ensured in step S102 and the information of the data page generated in step S103 to carry out the calculation of the second error correcting code (e.g., XOR (exclusive OR) calculation), and rewrites the result to the region for calculation of the second error correcting code ensured in step S102.

Next, the process in step S105 will be described. The non-volatile memory control unit 114 writes the information of the data page generated in step S103 to the physical write destination determined in step S101 through the non-volatile memory IF section 106.

Next, the process in step S106 will be described. If the data page written in immediately previous step S105 is the termination of the parity group, the process proceeds to the process of step S107. If not, the process returns to the process of step S103, and the writing of the next data page in the parity group is carried out. In this case, the writing is carried out through the word line different from the word line used in the writing process in previous step S105.

Next, the process in step S107 will be described. The code processing unit 113 generates the first error correcting code with respect to the parity with the calculation result of the second error correcting code generated in step S104 as the parity. The non-volatile memory control unit 114 writes the parity and the first error correcting code thereof as the parity page in the physical write destination determined in step S101 through the non-volatile memory IF section 106. In this case, the writing is carried out through the word line different from the word line used in the writing process in previous step S105.

Next, the process in step S108 will be described. When all the write data from the access device 2 is written, the writing process is terminated. If not, the process returns to the process of step S101, and as for the data from the access device 2, the writing of data for which the writing is not yet performed is continued.

The writing to the non-volatile memory 12 in step S105 and step S107 is desirably carried out at high speed by the interleave writing or the multi-page programming. In this case, the process proceeds to the process of the next step immediately after the writing of the data page and the parity page is started.

1.3.2 Reading Process

The reading process is carried out in the non-volatile storage device 1 when the access device 2 issues a read command to the non-volatile storage device 1. The read data is sequentially transferred from the non-volatile storage device 1 to the access device 2. FIG. 11 is a flowchart showing a procedure of the reading process of the non-volatile storage device 1 according to the first embodiment of the present invention.

First, the process in step S201 will be described. Upon receiving the read command from the access device 2 through the access device IF section 104, the command processing unit 111 acquires parameters such as read address and size associated with the read command, specifies the logical address of the parity group for carrying out the reading from these parameters, and notifies the information to the address management unit 112. The address management unit 112 determines the physical read destination in the non-volatile memory 12, by referencing the information acquired from the command processing unit 111, the information of the conversion table of the logical address and the physical address acquired from the logical address physical address association management portion 115, the address information of the free block, and the information of a table managing the write state to the block (e.g., state related to data of what logical address is written up to which page in which block).

Next, the process in step S202 will be described. The non-volatile memory control unit 114 carries out the reading of the information of the data page from the physical read destination determined in step S201 through the non-volatile memory IF section 106. The information of the read data page (i.e., data and first error correcting code with respect to data) is stored in the buffer 105.

Next, the process in step S203 will be described. The code processing unit 113 carries out error detection and correction of the data using the first error correcting code stored in the buffer 105 in step S202. If an error that cannot be corrected with the correction capability based on the first error correcting code is detected, the process proceeds to the process of step S204. In other cases, the error correction is carried out using the first error correcting code, the information after the error correction is overwritten on the data in the buffer 105, and the process proceeds to the process of step S206.

If the information of the data page read in step S202 includes information other than the read address specified by the access device 2 (e.g., when access device instructs reading from address in the middle of data page), the calculation of the first error correcting code with respect to the portion other than the read address may be omitted.

Next, the process in step S204 will be described. The non-volatile memory control unit 114 carries out the reading of the information of the parity group, to which the data page subjected to the reading in step S202 belongs, from the physical read destination determined in step S201 through the non-volatile memory IF section 106. Since the first error correcting code is given to the information of the read parity group (i.e., data page other than data page for which reading is carried out in step S202, and parity page), the code processing unit 113 stores the data and the parity in the buffer 105 after carrying out the error correction of the data using the first error correcting code.

Next, the process in step S205 will be described. The code processing unit 113 carries out the error detection and correction of the data using the information of the data page and the parity page (second error correcting code) stored in the buffer in step S204. If an error that cannot be corrected with the correction capability based on the second error correcting code is detected, the error process (not shown) is carried out, and the reading process is terminated. In other cases, the error correction is carried out using the second error correcting code, the information after the error correction is overwritten on the data in the buffer 105, and the process proceeds to the process of step S206.

For example, if the XOR (exclusive OR) calculation is applied for the calculation of the second error correcting code, the XOR calculation of the data of the data page other than the data page for which the reading is carried out in step S202 and the parity of the parity page is carried out. Accordingly, the data of the data page for which the reading is carried out in step S202 is restored.

Next, the process in step S206 will be described. The command processing unit 111 transmits the data (after error correction process) stored in the buffer 105 to the access device 2 as read data.

Next, the process in step S207 will be described. If all the read data specified by the access device 2 is transmitted, the reading process is terminated. If not, the process returns to the process of step S201, and as for the data to the access device 2, the reading of non-transmitted read data is continued.

The reading from the non-volatile memory 12 in step S202 and step S204 is desirably carried out at high speed by the interleave reading or the multi-page reading. In this case, the process proceeds to the process of the next step immediately after the reading of the data page and the parity page is started.

1.3.3 Initialization Process

After the non-volatile storage device 1 is attached to the access device 2, and the power supply from the access device 2 to the non-volatile storage device 1 is started, the access device 2 issues an initialization command to the non-volatile storage device 1 to enable the reading and writing of data between the access device 2 and the non-volatile storage device 1. FIG. 12 is a flowchart showing a procedure of an initialization process of the non-volatile storage device 1 according to the first embodiment of the present invention.

First, the process in step S301 will be described. Upon receiving an initialization command from the access device 2 through the access device IF section 104, the command processing unit 111 carries out an initialization setting of the hardware of the memory controller 11. The connection check of the non-volatile memory 12 connected to the non-volatile memory IF section 106 and the like is also carried out.

Next, the process in step 9302 will be described. The non-volatile memory control unit 114 reads first system information from a predetermined read destination of the non-volatile memory 12 through the non-volatile memory IF section 106. The first system information is information previously written in the non-volatile memory 12 at the time of the manufacturing of the non-volatile storage device 1, and includes various types of control information in the non-volatile storage device 1. The first system information may be the type and number of the non-volatile memories 12 connected to the memory controller 11, the information related to the pages sharing the word lines, the configuring information of the parity group, the type and correction capability of the first and second error correcting codes, the information related to a physical storage position of the second system information (to be described later), and the information related to the address of the initial defective block. When an error occurs in the reading of the first system information, the error correction by the first and/or second error correcting code is carried out.

The address management unit 112, the code processing unit 113, and the non-volatile memory control unit 114 carry out an internal initialization process according to the content of the read first system information.

Next, the process in step S303 will be described. The non-volatile memory control unit 114 reads the second system information from a predetermined read destination of the non-volatile memory 12 (e.g., specified in first system information) through the non-volatile memory IF section 106. The second system information is information that is updated when the non-volatile storage device 1 is used after the first system information is previously written to the non-volatile memory 12 at the time of the manufacturing of the non-volatile memory device 1, and includes various types of control information in the non-volatile storage device 1. The second system information includes, for example, the information related to the conversion table of the logical address and the physical address managed by the logical address physical address association management portion 115, the information related to the address of the latecoming defective block, the information related to the number of write times and the number of erase times of the block, the information related to the address of the free block, and the like. When error occurs in the reading of the second system information, the error correction by the first and/or second error correcting code is carried out.

Next, the process in step S304 will be described. The address management unit 112 generates in the RAM 102 the table information required for address management according to the content of the read second system information.

Next, the process in step S305 will be described. When an error exceeding a predetermined amount (correctable with first or second error correcting code) occurs in the reading from the non-volatile memory 12 in step S302 and step S303, the process proceeds to the process of step S306. If not, the process proceeds to the process of step S307.

Next, the process in step S306 will be described. The code processing unit 113 generates the first and second error correcting codes with respect to the data of an area where the error exceeding a predetermined amount occurred in the reading from the non-volatile memory 12 in step S302 and step S303. The non-volatile memory control unit 114 then rewrites the data and the generated first and second error correcting codes to the non-volatile memory 12 as new first or second system information.

Next, the process in step S307 will be described. The command processing unit 111 notifies the access device through the access device IF section 104 that the initialization process of the non-volatile storage device 1 is completed, and terminates the initialization process.

1.4 Conclusion

The non-volatile storage device 1 of the present embodiment is a non-volatile storage device that can communicate with the access device 2, and that carries out reading and/or writing of data in accordance with a command from the access device 2. The non-volatile storage device 1 includes one or more non-volatile memories 12 for storing data, and a memory controller 11 for carrying out the control of the non-volatile memory 12. The non-volatile memory 12 includes the plurality of blocks 121, which are erase units, and the block 121 includes the plurality of pages 122, which are write units of data, in each of the blocks 121 at least one set of pages exist which include at least two pages 122 sharing one word line. The memory controller 11 configures a plurality of error correcting groups, each including at least one data page, which is a page for storing data, and at least one error correcting code page for storing a code for error correcting calculation of the data page, and assigns a page of a separate word line with respect to each of the data page and the error correcting page in the same error correcting group.

As described above, in the non-volatile storage device 1, the second error correcting code is also stored in addition to the first error correcting code stored in the same page as the data. The parity group, which is a unit for storing the second error correcting code, is configured such that each data page and parity page does not share one word line. When writing the data, the first and second error correcting codes are given to the data and then written. When reading the data, if necessary, the error correction is carried out using the first and/or second error correcting code given to the data.

As a result, in the present embodiment, even if the failure occurs in one word line connected to the data page and the burst error occurs in the reading of the data page, the reading of other data pages and parity pages can be normally carried out since the other data pages and the parity pages configuring the parity group are connected to different word lines. Therefore, in this case, the information of the data page in which the burst error occurred can be restored using the information of the parity page (second error correcting code) and the information of the other data pages.

Furthermore, if a plurality of non-volatile memories connected to the memory controller exists, the data page and the parity page configuring the parity group are arranged over a plurality of non-volatile memories and a plurality of blocks in the non-volatile memory. Thus, the interleave writing, the high speed writing by the multi-page programming, the interleave reading, and the high speed reading by the multi-page reading can be carried out with respect to one or continuous parity groups.

In each parity group, the data page and the parity page configuring the parity group merely need to have different word lines, and do not necessarily need to be arranged in different non-volatile memories or different blocks. For example, at least two of the data pages and the parity pages configuring the parity group may be arranged in the same block. Therefore, the present embodiment can be applied even to a non-volatile storage device of a relatively small capacity in which the number of non-volatile memories to use is few.

In the present embodiment, the information related to the configuration of the error correcting (parity) group is stored in the non-volatile memory. Thus, the configuration of the error correcting (parity) group can be switched to a different arbitrary configuration by separately rewriting the information of the non-volatile memory.

Furthermore, in the present embodiment, the system information used by the non-volatile storage device is also stored in the non-volatile memory as data to become an element of the error correcting calculation in the error correcting (parity) group. Thus, the system information used by the non-volatile storage device can be protected from the burst error.

The values described in the above embodiment are merely an example, and other values may be used. For example, the values of the respective number of pages in the data page and the parity page configuring the parity group are all merely an example, and the present invention is not limited to the values described in the above embodiment.

Second Embodiment

A second embodiment of the present invention differs from the first embodiment only in the arrangement of the error correcting code. The configuration and the operation of the non-volatile storage system 1000 are similar to the first embodiment, and thus the description will be omitted and the difference will be mainly described.

2.1 Arrangement of Error Correcting Code

In the non-volatile storage device 1 according to the second embodiment of the present invention, the arrangement of the first and second error correcting codes of the case in which the memory controller 11 stores data in the non-volatile memory 12 will be described.

Figure 13:
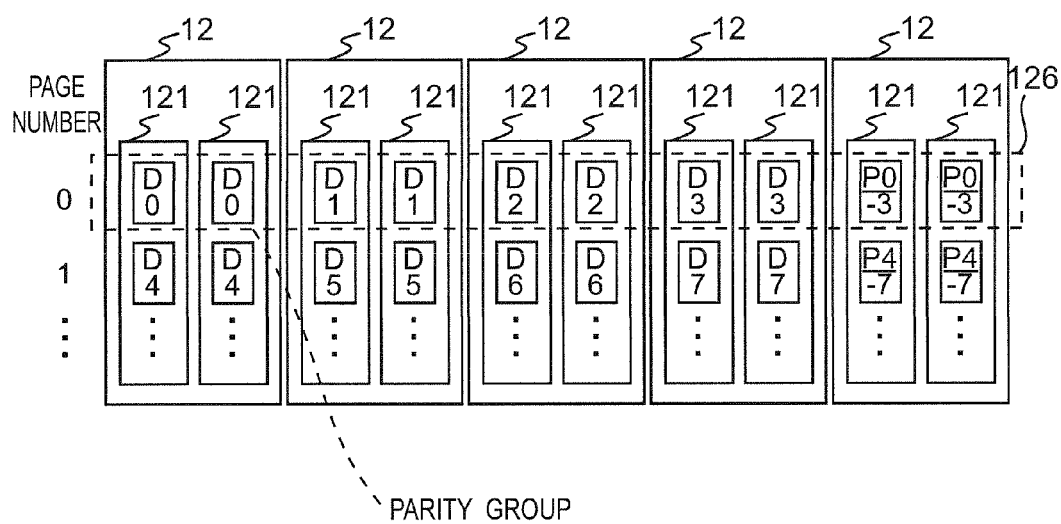
FIG. 13 is a diagram showing one example of a configuration of a parity group according to a second embodiment of the present invention.

The difference with the first embodiment is that the configuration of the parity group in the first embodiment is the configuration shown in FIG. 8, whereas the configuration in the second embodiment is the configuration shown in FIG. 13.

FIG. 13 is a diagram showing one example of a configuration of a parity group according to the second embodiment of the present invention. In FIG. 13, D0, D1, . . . , D7 represent the data page, P0-3 represents the parity page with respect to D0 to D3, and P4-7 represents the parity page from D4 to D7.

Figure 7:
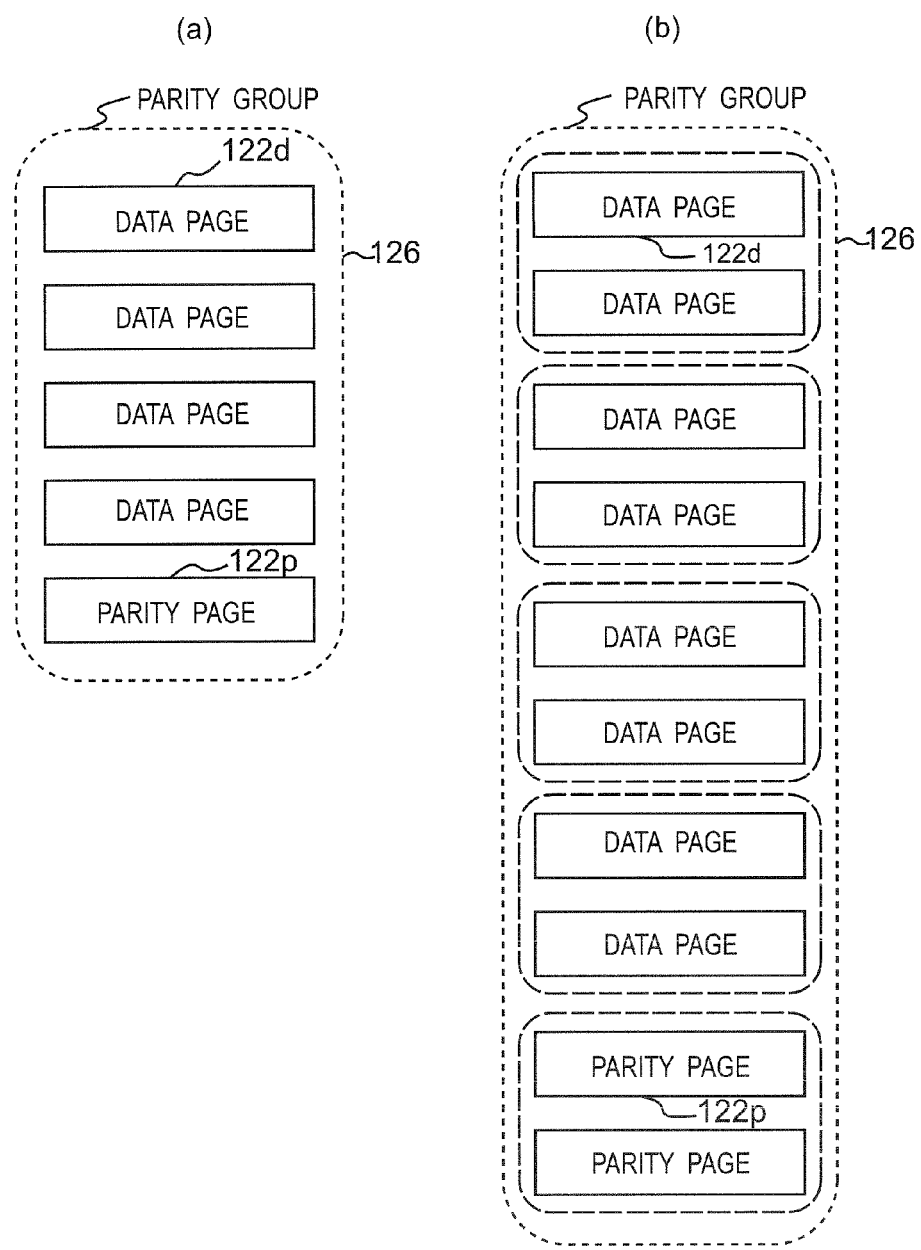
FIG. 7($a$) is a diagram showing one example of the parity group according to the first embodiment of the present invention, and FIG. 7($b$) is a diagram showing another example of the parity group according to the first embodiment of the present invention.

In the example according to the first embodiment shown in FIG. 8, one parity page is given with respect to the four data pages to configure one parity group, as shown in FIG. 7(*a*). On the other hand, in the example according to the second embodiment shown in FIG. 13, one pair of parity pages are given to the four pairs of data pages to configure one parity group, as shown in FIG. 7(*b*).

In the present embodiment, one parity group is arranged over five non-volatile memories 12 and ten blocks 121.

Although such difference exists, the second embodiment is similar to the first embodiment in that the data pages and the parity pages configuring each parity group are arranged so as "not to share the word line". Therefore, the information of the data page in which the burst error occurred can be restored by using the parity page (second error correcting code).

Other Embodiments

The present invention has been described based on the above embodiments, but the present invention is, of course, not limited to only the above embodiments, and the embodiments can be changed within a scope not deviating from the technical concept of the invention. Changes can be made as below.

(1) In the access device 2, the non-volatile storage device 1, the memory controller 11, and the non-volatile storage system 1000 of the embodiments described above, each function block may be individually formed to one chip by a semiconductor device such as an LSI, or may be formed to one chip so as to include part of or all of the function blocks.

In the above description, the LSI has been provided by way of example, but the function block may be formed to a chip by a semiconductor device such as IC (Integrated Circuit), system LSI, super LSI, ultra LSI, or the like due to the difference in degree of integration.

Moreover, the method of forming an integrated circuit is not limited to the LSI, and an integrated circuit may be realized with a dedicated circuit or a general-purpose processor. Furthermore, an FPGA (Field Programmable Gate Array) capable of being programmed after the LSI manufacturing, or a reconfigurable processor capable of reconfiguring the connection and the setting of the circuit cells in the LSI may be used.

Further, if a technique of forming an integrated circuit that replaces the LSI appears according to a different technique advanced or derived from the semiconductor technique, the integration of the function blocks may, of course, be carried out using such a technique. For example, biotechnology or the like may be applied.

(2) Each process in the embodiments described above may be implemented by hardware, or may be implemented by software (including cases of being realized with OS (operating system), middleware, or predetermined library). Furthermore, each process may be realized by a mixed process of software and hardware. It should be recognized that the timing adjustment for carrying out each process needs to be carried out when implementing the access device 2, the non-volatile storage device 1, and the non-volatile storage system 1000 according to the above-described embodiments by hardware. In the above-described embodiments, the details of the timing adjustment of various types of signals generated in the actual hardware design is omitted for the sake of convenience of explanation.

Moreover, the executing order of the processing method in the embodiments described above is not necessarily limited to the described content of the embodiments described above, and the executing order can be interchanged within a scope not deviating from the technical scope of the present invention.

(3) The non-volatile storage device according to the above embodiments has been described as a detachable storage device like a semiconductor memory card, but may be realized as an information storage module of a type that can be incorporated in a substrate of the access device.

The non-volatile storage device and the memory controller according to the present invention can correctly read the stored data to the non-volatile memory even if the burst error caused by a failure in the word line occurred, and the reliability of the stored data can be enhanced. This is obviously useful in the semiconductor memory card, but also in digital still camera, portable telephone terminal, movie, digital television, DVD recorder and the like which are information terminals incorporating the non-volatile memory. The present invention thus can be used in the field related to semiconductor memories.

What is claimed is:

1. A non-volatile storage device, which communicates with an access device and carries out reading and/or writing of data in accordance with a command from the access device, the storage device comprising:

one or more non-volatile memories for storing data; and
   a memory controller for carrying out control of the non-volatile memory; wherein
   the non-volatile memory includes
     a plurality of blocks, which are erase units, each of the blocks including a plurality of pages, which are write units of data, in each of the blocks at least one set of pages existing which include at least two pages sharing one word line; and
   the memory controller,
     configures a plurality of error correcting groups each including at least one data page, which is a page for storing data, and at least one error correcting code page for storing a code for error correcting calculation of the data page, and
     assigns a page of a separate word line with respect to each of the data page and the error correcting page in the same error correcting group.

2. The non-volatile storage device according to claim 1, wherein the error correcting calculation is parity.

3. The non-volatile storage device according to claim 1, wherein
   a logical block is configured by combining n (n: integer greater than or equal to 2) blocks in which parallel writing and/or parallel reading is enabled; and
   the error correcting group is assigned over the plurality of blocks in which parallel writing and/or parallel reading is enabled.

4. The non-volatile storage device according to claim 1, wherein at least two pages of the data page and the error correcting page in the same error correcting group are stored in the same block.

5. The non-volatile storage device according to claim 1, wherein information related to a configuration of the error correcting group is acquired from the non-volatile memory.

6. The non-volatile storage device according to claim 1, wherein system information used by the non-volatile storage device is stored in the non-volatile memory as the data page in the error correcting group.

7. A memory controller for carrying out control of one or more non-volatile memories for storing data, wherein
   the non-volatile memory includes
     a plurality of blocks, which are erase units, each of the blocks including a plurality of pages, which are write units of data, in each of the blocks at least one set of pages existing which include at least two pages sharing one word line; and
   the memory controller,
     configures a plurality of error correcting groups each including at least one data page, which is a page for storing data, and at least one error correcting code page for storing a code for error correcting calculation of the data page, and
     assigns a page of a separate word line with respect to each of the data page and the error correcting page in the same error correcting group.

8. The memory controller according to claim 7, wherein the error correcting calculation is parity.

9. The memory controller according to claim 7, wherein
   a logical block is configured by combining n (n: integer greater than or equal to 2) blocks in which parallel writing and/or parallel reading is enabled; and
   the error correcting group is assigned over the plurality of blocks in which parallel writing and/or parallel reading is enabled.

10. The memory controller according to claim 7, wherein at least two pages of the data page and the error correcting page in the same error correcting group are stored in the same block.

11. The memory controller according to claim 7, wherein information related to a configuration of the error correcting group is acquired from the non-volatile memory.

12. The memory controller according to claim 7, wherein system information used by the non-volatile storage device is stored in the non-volatile memory as data to become an element of the error correcting calculation in the error correcting group.

* * * * *